United States Patent [19]
Furuya et al.

[11] Patent Number: 5,598,219
[45] Date of Patent: Jan. 28, 1997

[54] DATA EXTRACTING APPARATUS FOR VALIDATING DATA MULTIPLEXED IN A VIDEO SIGNAL

[75] Inventors: Miki Furuya, Saitama; Tadashi Ezaki, Tokyo; Teruhiko Kori; Satoshi Tsuchiya, both of Kanagawa, all of Japan

[73] Assignee: Sony Corporation, Tokyo, Japan

[21] Appl. No.: 497,441

[22] Filed: Jun. 30, 1995

[30] Foreign Application Priority Data

Jul. 1, 1994 [JP] Japan ............................ 6-173517

[51] Int. Cl.$^6$ ............................................ H04N 7/087
[52] U.S. Cl. .................................. 348/465; 348/537
[58] Field of Search ............................ 348/465, 464, 348/468, 461, 537, 536, 512, 518, 500, 478, 462, 466, 572; 375/355, 357, 359, 362, 376; H04N 7/087, 7/08

[56] References Cited

U.S. PATENT DOCUMENTS

| | | | |
|---|---|---|---|
| 4,052,719 | 10/1977 | Hutt et al. | 348/468 |
| 4,277,838 | 7/1981 | Chambers | 348/468 |
| 4,667,235 | 5/1987 | Nozoe et al. | 348/464 |
| 4,712,131 | 12/1987 | Tanabe | 348/464 |
| 4,768,228 | 8/1988 | Clupper et al. | 348/478 |
| 5,404,172 | 4/1995 | Berman et al. | 348/465 |

*Primary Examiner*—John K. Peng
*Assistant Examiner*—Nathan J. Flynn
*Attorney, Agent, or Firm*—William S. Frommer; Alvin Sinderbrand

[57] ABSTRACT

Only the data sampled by a correct sampling clock is data processed. A PLL circuit 5 generates a sampling clock locked with a sync signal in a video signal and supplies to a sampling circuit 4. A lock flag indicating whether the generated sampling clock is correctly synchronized with the sync signal or not is also generated. The data multiplexed to the sync signal is sampled by the above sampling clock. The data is stored in a memory 7. The lock flag is supplied to a controller 2 and the data that is outputted from the memory 7 is made valid or invalid according to the level of the lock flag.

4 Claims, 3 Drawing Sheets

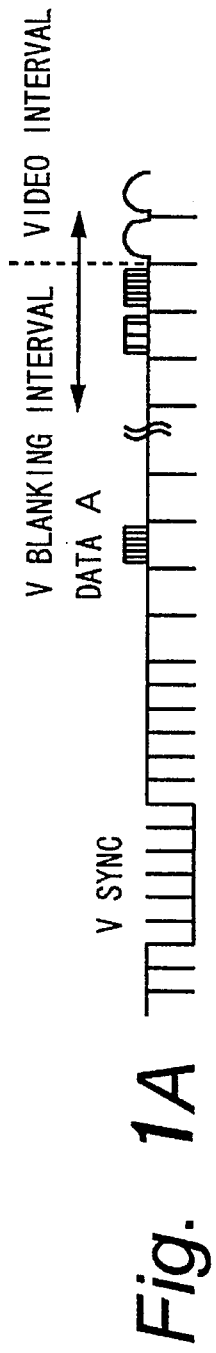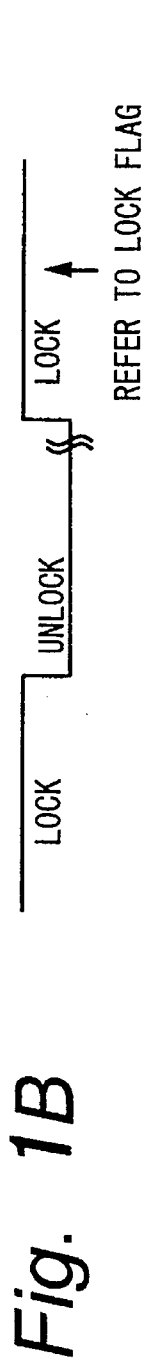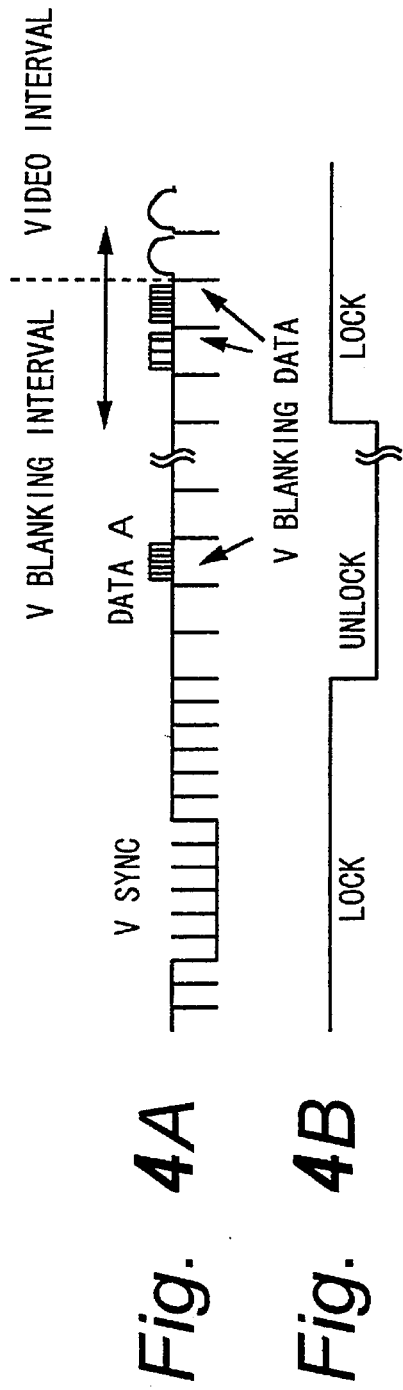
Fig. 1A
Fig. 1B
Fig. 4A
Fig. 4B
Fig. 4C

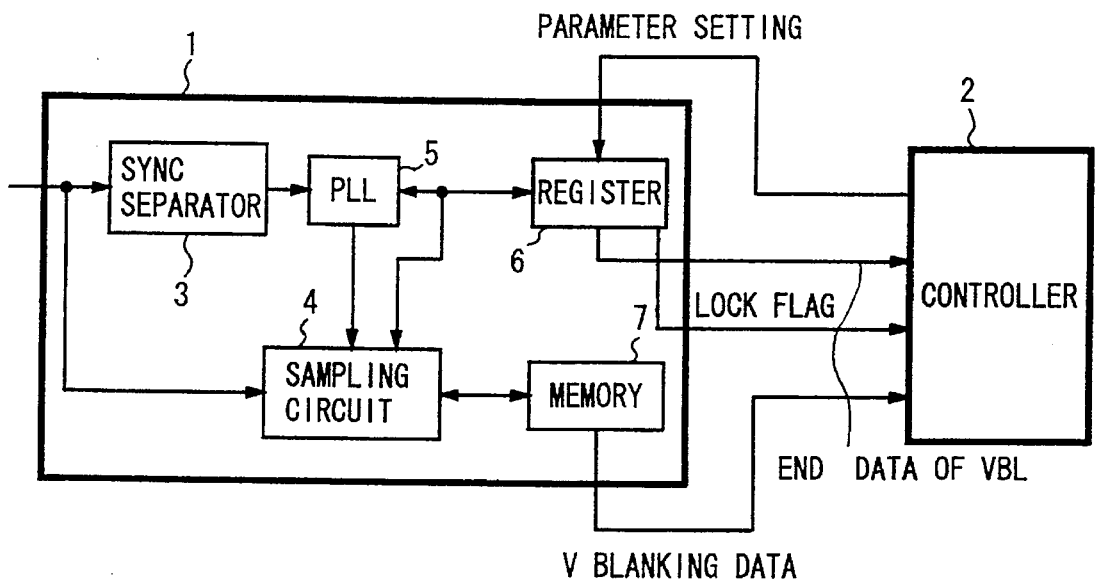
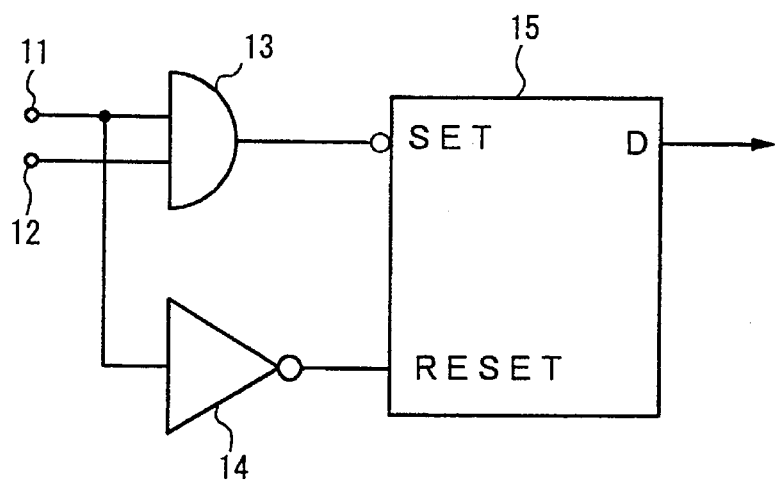
Fig. 3

DATA EXTRACTING APPARATUS FOR VALIDATING DATA MULTIPLEXED IN A VIDEO SIGNAL

BACKGROUND OF THE INVENTION

1. Field of the Invention

The invention relates to a data extracting apparatus for extracting various data inserted in a vertical blanking interval.

2. Description of the Related Art

A signal for a character broadcasting and an ID signal and the like of video addition information such as an aspect ratio and the like have been inserted in the V blanking interval of a television signal. By decoding those signals, the user can accept various services. As for those data inserted in the V blanking interval, the inserted line numbers differ in accordance with their kinds. In order to decode the data corresponding to each service, the user must prepare a number of decoders corresponding to the kinds of services.

To solve such a problem, a general decoder is known. The general decoder can decode various data inserted in lines of different V blanking intervals. FIGS. 1A and 1B show waveform diagrams of the V blanking interval and a waveform diagram of a lock flag. Data A is inserted in the V blanking interval of a television signal as shown in FIG. 1A. Data A is stored in a memory in the decoder. When the V blanking interval is finished, the decoded data is read out and a predetermined process is executed by a controller. In case of storing the data into a memory, if a PLL circuit is not locked, data A cannot be correctly sampled. Therefore, in order to confirm a locking state of the PLL circuit, the decoder refers to a lock flag. A waveform of the lock flag is shown in FIG. 1B. The lock flag is a flag indicating whether the sampling clock formed by the PLL circuit is correct or not. In this instance, it is assumed that the lock flag simply indicates the present locking state of the PLL circuit. When the PLL circuit is locked, its level is set to the H level. When the PLL circuit is not locked, the level is set to the L level.

The actual data process is executed after the end of the V blanking interval. The lock flag is referred to after the V blanking interval. Therefore, the locking state of the PLL at a time point when the lock flag is referred to is merely known and the locking state in the V blanking interval cannot be known. For example, in FIG. 1A, in the case where the PLL circuit is in an unlocked state when the data A is sampled and the PLL circuit enters a locking state before the lock flag is referred to, a data process is executed in spite of the fact that the data A is not correctly sampled.

OBJECTS AND SUMMARY OF THE INVENTION

In order to prevent such a data process, it is necessary to continuously refer to the lock flag in the V blanking interval or a flag to judge whether the PLL has been performed at that time or not every data is needed. However, according to such a method, the process is complicated.

It is, therefore, an object of the invention to provide a data extracting apparatus which can decode only data sampled by a correct sampling clock.

The invention relates to a data extracting apparatus for extracting data multiplexed in a predetermined interval of a video signal, comprising: a PLL circuit for generating a sampling clock locked with a sync signal in the video signal and for generating a flag indicating whether the sampling clock is correctly locked with the sync signal or not; and a memory for storing the data sampled by the sampling clock, wherein the sampled data is made valid or invalid on the basis of a status of the flag.

The sampling clock locked with the sync signal in the video signal is generated and the lock flag indicating a locking state of the PLL circuit 5 is also generated by the PLL circuit 5. The data in the V blanking interval is sampled by the sampling clock and is stored in the memory 7. A controller 2 detects a status of the lock flag. When the lock flag is at the H level, the data stored in the memory 7 is made valid, and when it is at the L level, the data is made invalid.

According to the invention, in the case where the PLL is unlocked in the V blanking interval, since the lock flag is held at the L level, it is possible to know that the data was not sampled by the correct sampling clock even if the lock flag is referred to after the end of the V blanking interval. Further, in the case where the lock flag is at the H level by referring to the lock flag after the end of the V blanking interval, a fact that the PLL has been always locked in the V blanking interval can be guaranteed. Therefore, only the data which was correctly sampled can be processed in a locking state of the PLL.

The above, and other objects, features and advantages of the present invention will become readily apparent from the following detailed description thereof which is to be read in connection with the accompanying drawings.

BRIEF DESCRIPTION OF THE DRAWINGS

FIGS. 1A and 1B are waveform diagrams of the V blanking interval and waveform diagram of the lock flag which are used for explaining a prior art;

FIG. 2 is a block diagram of a data extracting apparatus according to the invention;

FIG. 3 is a block diagram of a locking state detecting circuit;

FIGS. 4A, 4B and 4C are waveform diagrams of a lock flag obtained by the data extracting apparatus.

DETAILED DESCRIPTION OF THE PREFERRED EMBODIMENTS

Figure 5:
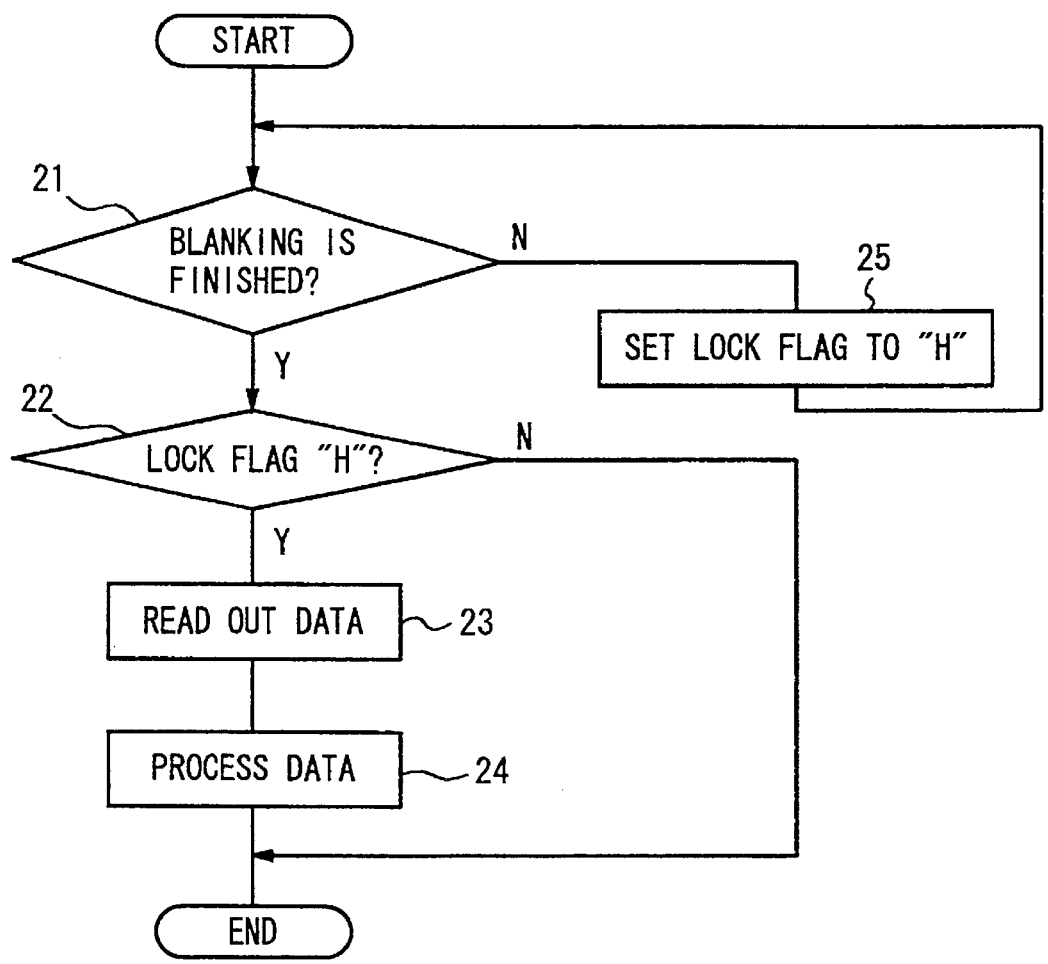
FIG. 5 is a flowchart regarding the operation after a V blanking interval of the data extracting apparatus.

A data extracting apparatus according to the invention will now be described hereinbelow with reference to the drawings. FIG. 2 is a block diagram of the data extracting apparatus. The data extracting apparatus comprises a V blanking general decoder 1 and a controller 2. Video data is supplied to a sync separator 3 and a sampling circuit 4 of the V blanking general decoder 1. An H sync and a V sync in the video data are separated by the sync separator 3. The H sync and V sync are supplied to a PLL circuit 5. On the other hand, parameters such as sampling clock frequency, line number, and the like are set by the controller 2. The parameter set values are supplied to a register 6.

The parameter set values are supplied from the register 6 to the PLL circuit 5 to which the H sync and V sync were supplied. The PLL circuit 5 generates a sampling clock locked with a sync in accordance with the parameter set values. The sampling clock is supplied to the sampling circuit 4. The parameter set values are supplied to the sampling circuit 4 from the register 6. The sampling circuit 4 samples the data of a line designated by the parameters by the designated number of bits on the basis of the sampling clock and the parameter set values. The data sampled by the sampling circuit 4 is stored in a memory 7. The stored data is read out by the controller 2.

The PLL circuit 5 outputs a lock flag at the H level indicating a locking state to the register 6. In case of the lock flag of the H level, the data stored in the memory 7 is made valid. The lock flag is outputted to the controller 2 from the register 6. Thus, the controller 2 can confirm that the data in the V blanking interval read out from the memory 7 was sampled by the correct clock. When the PLL circuit 5 is not locked with the sync, a correct sampling clock is not generated. Therefore, the lock flag of the L level is generated to the register 6 from the PLL circuit 5. In case of the lock flag of the L level, the data stored in the memory 7 is made invalid. When the V blanking interval is finished, V blanking end data is supplied to the controller 2 from the V blanking general decoder 1.

FIG. 3 is a block diagram of a locking state detecting circuit to output the lock flag to the register 6 from the PLL circuit 5. This circuit is constructed by an AND gate 13, a NOT gate 14, and a D flip-flop 15. A lock status flag indicating a locking state is generated from one input terminal 11 of the AND gate 13. The locking status flag is also supplied to the NOT gate 14. A V sync in the video data is inputted from another input terminal 12 of the AND gate 13. An inverted output of the AND gate 13 is supplied to a set terminal Set of the D flip-flop 15. On the other hand, an output of the NOT gate 14 is supplied to a reset terminal Reset of the D flip-flop 15. The lock flag is outputted to a register (not shown) from a D output terminal of the D flip-flop 15.

FIGS. 4A, 4B and 4C are waveform diagrams of the lock flag obtained by the data extracting apparatus according to the invention. In order to explain the waveform of the lock flag, awaveform diagram of the V blanking interval and a waveform diagram showing the locking state of the PLL circuit are shown. In the case where the PLL circuit is locked as shown in FIG. 4B with a V sync of the V blanking interval as shown in FIG. 4A, the lock flag is set to the H level at a start point of the V sync. When the PLL circuit is unlocked in the V blanking interval, the lock flag is set to the L level synchronously with the unlocking. Accordingly, the data that is output from the D terminal of the D flip-flop is set to the L level.

Namely, in the case where the PLL is unlocked in the V blanking interval, since the lock flag is held at the L level, even if the lock flag is referred to after the end of the V blanking interval, it can be recognized that the PLL was unlocked in the V blanking interval. When the lock flag is at the H level at a time point when the lock flag is referred to after the end of the V blanking interval, it is assured that the PLL has been always locked in the V blanking interval. Therefore, only the data which was correctly sampled can be processed in a locking state of the PLL.

FIG. 5 is a flowchart regarding the operation after the end of the V blanking interval of the data extracting apparatus. In step 21, a check is made by the controller 2 to see if the V blanking interval is finished or not. When the V blanking interval is not finished, after the lock flag which is supplied to the register 6 from the PLL circuit 5 was set to the H level (step 25), a processing routine is returned to step 21. On the other hand, when it is judged in step 22 that the V blanking interval was finished, step 22 follows. In step 22, it is judged whether the PLL circuit 5 has been locked or not (the lock flag is at the H level or not). When the lock flag is not at the H level, since this means that the PLL is unlocked in the V blanking interval, the process is finished. On the other hand, in step 22, when it is judged that the lock flag is at the H level, the data written in the memory 7 is read out (step 23) and a predetermined data process is executed (step 24).

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A data extracting apparatus for extracting data multiplexed to a predetermined interval of a video signal, comprising:

a PLL circuit for generating a sampling clock phase locked with a sync signal transmitted in said video signal and for generating a lock flag indicating whether said sampling clock is correctly phase locked with said sync signal;

a sampling circuit for sampling the video signal in time with the sampling clock; and a memory for storing data sampled by said sampling circuit, wherein said data is designated as valid or invalid on a basis of a status of said lock flag when the data is sampled.

2. A data extracting apparatus according to claim 1, wherein said predetermined interval is a vertical blanking interval.

3. A data extracting apparatus according to claim 1 further comprising:

a register for outputting a reference flag indicating whether the lock flag indicated that the sampling clock was phase locked while the data was sampled; and a control circuit for designating said sampled data as being valid or invalid on a basis of a status of said reference flag.

4. A data extracting apparatus according to claim 3, wherein said reference flag is cleared at a cycle of a vertical sync signal of said video signal.

* * * * *